United States Patent
Gast et al.

(10) Patent No.: US 7,244,315 B2
(45) Date of Patent: Jul. 17, 2007

(54) MICROELECTRONIC DEVICE DRYING DEVICES AND TECHNIQUES

(75) Inventors: Tracy A. Gast, Waconia, MN (US); Stephen C. Loper, Eden Prairie, MN (US); Thomas J. Wagener, Shorewood, MN (US)

(73) Assignee: FSI International, Inc., Chaska, MN (US)

( * ) Notice: Subject to any disclaimer, the term of this patent is extended or adjusted under 35 U.S.C. 154(b) by 244 days.

(21) Appl. No.: 10/608,894

(22) Filed: Jun. 27, 2003

(65) Prior Publication Data

US 2005/0067001 A1 Mar. 31, 2005

(51) Int. Cl.
*B08B 3/00* (2006.01)

(52) U.S. Cl. .............................. 134/26; 134/2; 134/21; 134/30; 134/34; 134/36; 134/42; 134/902

(58) Field of Classification Search .................. 134/26, 134/2, 21, 902, 30, 34, 36, 42
See application file for complete search history.

(56) References Cited

U.S. PATENT DOCUMENTS

| | | | |
|---|---|---|---|
| 5,940,985 A * | 8/1999 | Kamikawa et al. ........... 34/471 |
| 5,974,689 A * | 11/1999 | Ferrell et al. .................. 34/340 |
| 2001/0047595 A1* | 12/2001 | Mehmandoust .............. 34/443 |
| 2003/0121170 A1* | 7/2003 | Achkire et al. ................. 34/78 |
| 2003/0183338 A1* | 10/2003 | Kashkoush et al. ..... 156/345.29 |
| 2004/0050405 A1* | 3/2004 | Christenson et al. ....... 134/25.4 |
| 2004/0194806 A1* | 10/2004 | Yang et al. .................... 134/18 |

* cited by examiner

*Primary Examiner*—Sharidan Carrillo
(74) *Attorney, Agent, or Firm*—Kagan Binder, PLLC

(57) ABSTRACT

Improved methods of rinsing and drying microelectronic devices by way of an immersion processing apparatus are provided for effectively cleaning microelectronic devices. Methods and arrangements control the separation of one or more microelectronic devices from a liquid environment as part of a replacement of the liquid environment with a gas environment. Cleaning enhancement substance, such as IPA, is introduced into the gas environment according to a controlled profile while the separation step is conducted. The controlled profile being directed to the timing of introduction of cleaning enhancement substance, the concentration of cleaning enhancement substance and/or flow rates thereof into the vessel. Controlled timing of gas and cleaning enhancement substance delivery can also improve effectiveness of separation. Methods and arrangements are also provided for controlling a drying step to be conducted on the one or more microelectronic devices after they have been separated from a liquid environment by replacing the liquid environment with a gas environment. Preferably, an arrangement of gas distribution devices create one or more drying gas curtains, which gas curtains may be controllably directed with respect to a set of microelectronic devices to provide optimal drying of the microelectronic devices after being separating from a liquid.

9 Claims, 10 Drawing Sheets

FIG. 9

MICROELECTRONIC DEVICE DRYING DEVICES AND TECHNIQUES

FIELD OF THE INVENTION

The present invention relates to immersion or wet processing and cleaning of microelectronic devices, such as semiconductor microelectronic devices, and to enhanced techniques and methods for optimizing the rinsing and cleaning aspects of such devices. In particular, the present invention is directed to improving an aspect of such rinsing and cleaning operation wherein such microelectronic devices are cleanly separated from a liquid bath.

BACKGROUND OF THE PRESENT INVENTION

At some point during any immersion or wet processing operation, the object being processed is separated from its liquid bath. This may occur many times depending on such process and device at intermediate or final stages of processing. Such may occur in one or more immersion vessels as sequential steps or separated by other different process steps. As a general matter, and depending of the process, it may be desirable to rinse an object for cleaning it after being subjected to processing fluid in order to remove any contaminants or residual processing fluid. Moreover, the object may be further dried to remove any processing or rinsing liquids and to provide a clean processed object.

In the case of processing microelectronic devices, such as those including semiconductor wafers and microelectronic devices at any of various stages of processing, flat panel displays, micro-electrical-mechanical-systems (MEMS), advanced electrical interconnect systems, optical components and devices, components of mass data storage devices (disk drives), and the like, cleanliness is critical in virtually all processing aspects. Representative steps in immersion processing of microelectronic devices include microelectronic device etching and rinsing. As used herein, immersion processing means a process where at least a portion of a device, such as a microelectronic device, is subjected to immersion for a period of time for any effective purpose.

One important aspect in providing clean microelectronic devices after immersion processing is to start with the use of clean processing liquids. Clean liquid use can be controlled by known or developed filtering processes so as to minimize introduction of contaminants into the processing environment. This is particularly true where devices are being cleaned or rinsed by an immersion process, such as by using deionized water (DI water) as a rinsing liquid as either flowing or non-flowing liquid bath. Specific filtering techniques for ultra-clean DI water have been developed for use in the microelectronic industry, such as those described in U.S. Pat. Nos. 5,542,441, 5,651,379 and 6,312,597 to Mohindra et al. Microelectronic devices are often rinsed within vessels as a batch or individually by flowing DI water across device surfaces as supported within the vessel and cascading the DI water from the vessel. Such a process vessel for microelectronic device rinsing is commonly referred to as a cascade rinser. Cascade rinsing typically utilizes an immersion vessel having inner and outer chambers that are separated from one another by a partition or weir. One or more devices are positioned within the inner chamber of the immersion vessel. Rinse liquid, such as DI water, is supplied to the inner chamber from a source even after the inner chamber is filled. For some desired period of time then, the rinse liquid overflows and cascades over the weir into the outer chamber. That way contaminants that may be dislodged and/or residual process fluid desirably flow with the cascaded liquid from the inner chamber and away from the devices.

It is also just as important to prevent contamination or recontamination to a surface of a microelectronic device, as such contaminant may be present in the processing liquid as a result of being supplied within the process liquid, as previously dislodged from a device surface, or as a result of the device processing (including previously used processing liquids or other liquid contaminants). This is particularly true when separating the microelectronic device(s) from the liquid bath so that no substantial surface contamination occurs from contaminants that may be suspended within the rinse or other processing liquid. Microelectronic devices may be separated from any liquid bath by lifting the devices from the bath or draining the liquid bath, or a combination of the two. During such separation, contaminants that may be near a device surface during separation can sometimes be deposited onto a device surface depending on surface and particle features, affinities and sizes.

Regardless of the mechanisms involved, the basic step of separation may simply be characterized as the controlled replacement of a liquid environment about an object or portion thereof with a gas environment. As a result, the object or portion thereof is separated from the liquid. In an inline process, separation is typically done by replacing one fluid that is supplied inline with a subsequent fluid (e.g., changing from rinse liquid to clean gas). See, for example, U.S. Pat. Nos. 4,984,597 and 4,911,761 to McConnell et al. For a liquid bath type immersion process (i.e., where one or more microelectronic devices are supported or suspended within liquid contained by a vessel), the liquid environment can be controllably replaced with a gas environment by lifting or draining, as above.

In order to enhance this separation step, processes have been developed that introduce a substance within the gas environment during the replacement stage about an object that causes the liquid to shed more easily from the object surfaces. By shedding the liquid better, there is less a likelihood that any contaminant would be deposited onto an object surface from the liquid, and there is an increased chance to remove any such contaminant from an object surface. Developed processes utilize isopropyl-alcohol (IPA), in particular, to take advantage of what is known as the Marongoni effect to create a gradient in the concentration of the IPA mixed with the liquid at or near the liquid/gas meniscus formed at the object surfaces. The concentration gradient causes an acceleration of the liquid from an object surface as liquid having a greater concentration of the IPA within such a meniscus has an increased tendency to flow toward a more dilute mixture of IPA within the liquid bath. Many processes and systems have been developed taking advantage to various degrees such Marongoni effect to enhance rinsing and cleaning of microelectronic devices.

In particular, certain apparatuses and methods have been developed as are described with U.S. Pat. No. 5,772,784 to Mohindra et al, and which is owned by the assignee of the present invention. Described processes steps include the introduction of IPA as a cleaning enhance substance within a carrier gas stream for delivering a dilute concentration of IPA within the gas environment as it replaces the liquid environment caused by draining the immersion vessel. The IPA is relied upon, as described above, to increase the tendency of the liquid to flow from object surfaces during the step of separating the object(s) from the liquid.

Whereas the main goal of separation is to leave clean device surfaces, the separation step itself, however, does not necessarily result in dry devices. That is, after a rinsing step, a separate drying step may be performed to dry liquid drops or films that may still be present. A particular drying operation utilized depends on parameters of the separation (e.g. speed of separation, orientation of the microelectronic devices, and the like) as well as characteristics of the microelectronic devices themselves (e.g. the hydrophilic or hydrophobic nature of the device surface). Any liquid droplets or films that remain on a microelectronic device surface after separation, such as may result at or near contact points with support structure or as minute droplets or films that hold to the microelectronic device surface, are desirably removed from the microelectronic device surface. If such droplets or films are left to evaporate from the microelectronic device surface, any contaminants within the droplets or films can be deposited on the microelectronic device surface, which contaminants may render a portion of the microelectronic device unsuitable for further processing or use. Known drying techniques include the use of heated gases, such as heated nitrogen gas, after the rinsing step for removing unwanted droplets and films from the microelectronic device surfaces.

SUMMARY OF THE PRESENT INVENTION

The present invention overcomes certain shortcomings of the prior art by improving the methods of rinsing and drying microelectronic devices by way of an immersion processing apparatus and for effectively cleaning microelectronic devices.

In one aspect, the present invention is directed to methods and arrangements for controlling the separation of one or more microelectronic devices from a liquid environment and the replacement of the liquid environment with a gas environment. In particular, cleaning enhancement substance, such as IPA, is introduced into the gas environment according to a controlled profile while the separation step is conducted. The controlled profile potentially including, according to a desired process, not only when the introduction of cleaning enhancement substance is commenced and ceased, but also the concentration of cleaning enhancement substance and flow rates thereof into the vessel.

According to certain preferred methods, flow rates of even or differing gas concentrations of cleaning enhancement substance can be varied according to selected stages of separation. In a preferred technique, gas mixture flow rates can be increased or decreased in stages or gradually over time at a fixed or varied slope as the separation progresses. Where an immersion vessel is drained to cause such separation of one or more microelectronic devices from a liquid, the flow rate of gas mixed with cleaning enhancement substance can be increased as the liquid level becomes lower in the vessel. That way, gas flow can be minimized when the liquid level is high, in particular, where the gas mixture is introduced from above to minimize rippling of the liquid surface and any influence of surface flow of the liquid. Flow rates can be increased one or more times as the level lowers to ensure sufficient delivery of cleaning enhancement substance to the liquid top surface and thus the menisci formed at the one or more devices. Concentration of cleaning enhancement substance can be the same or varied over time as well.

Controlled timing of gas and cleaning enhancement substance delivery can also improve effectiveness of separation. By continuing flow of the gas and cleaning enhancement substance even after separation of one or more device is complete, liquid drops or film left on any device surface can be better contained on such surface. Such containment can be effected by such continued flow up until, into or throughout a subsequent drying step. That way, potential contamination from any contaminant within such drop or film can be limited to that specific area where the drop or film was contained. This is particularly advantageous where drops are formed within exclusion zones, such as a commonly provided with certain microelectronic devices or microelectronic devices, and as such are typically formed at carrier contact points that contact such devices at an edge thereof.

In another aspect, the present invention is directed to methods and arrangements for controlling a drying step to be conducted on the one or more microelectronic devices after they have been separated from a liquid environment by replacing the liquid environment with a gas environment. As noted above, steps or methods of the separating step can be carried over into a drying step, for example, to contain liquid drops or films. The drying operation itself is also preferably controlled to enhance drying of all desired surfaces of such microelectronic devices. A preferred method of drying microelectronic devices is to utilize clean gas flow directed across such devices to cause liquid to evaporate or for the liquid to be blown from the device surface.

Contact points between a carrier or other support or handling structure and the one or more microelectronic devices are where liquid is more likely to accumulate after a separation step. However, other points may retain some liquid based upon other characteristics of the operation including the speed of separation, orientation of the microelectronic devices, and the like, as well as characteristics of the microelectronic devices themselves, such as the hydrophilic or hydrophobic nature of the device surface. For example, liquid accumulating at the low point of a circular microelectronic device arranged vertically is a known possibility. Liquid accumulation at contact points or low spots can be even more difficult to dry where many microelectronic devices are arranged in a spaced stack, for example, or anywhere where adjacent surfaces are relatively close to one another as compared with device dimensions. Such closely spaced surfaces can be sheltered by other surfaces to reduce effectiveness of gas flow drying techniques.

Thus, it is also desirable to control a drying operation by effectively controlling gas flow as directed about one or more microelectronic devices after separation from a liquid environment. Preferable an apparatus is provided including an arrangement of one or more nozzles that extend at least partially across an immersion vessel interior cavity. Preferably, an arrangement of gas distribution devices create one or more drying gas curtains, which gas curtains may be controllably directed with respect to a set of microelectronic devices to provide optimal drying of the microelectronic devices after being separating from a liquid. Gas curtains in accordance with the present invention can result from the arrangement of plural nozzles and/or based upon the specific nozzle design of each nozzle, such as on the size, spacing and number of gas directing orifices. Preferably, the size and number of nozzles is substantially related to the number and arrangement of microelectronic devices to be processed within the vessel.

Utilizing such controllably directable gas curtains has many benefits. A simple mechanical design may be used which includes minimal moving parts. Gas distribution devices for providing gas curtains in accordance with the present invention may be formed from simple structures and may not require complex gas handling techniques. Moreover, controllably directed gas curtains can advantageously be utilized to adjust the drying characteristics a particular immersion processing apparatus and microelectronic device size.

BRIEF DESCRIPTION OF THE DRAWINGS

FIG. 9 is a schematic view similar to FIG. 8 showing the liquid environment being replaced with a gas environment and with cleaning enhance substance being introduced into the gas environment.

DETAILED DESCRIPTION OF THE PREFERRED EMBODIMENTS

Figure 1:
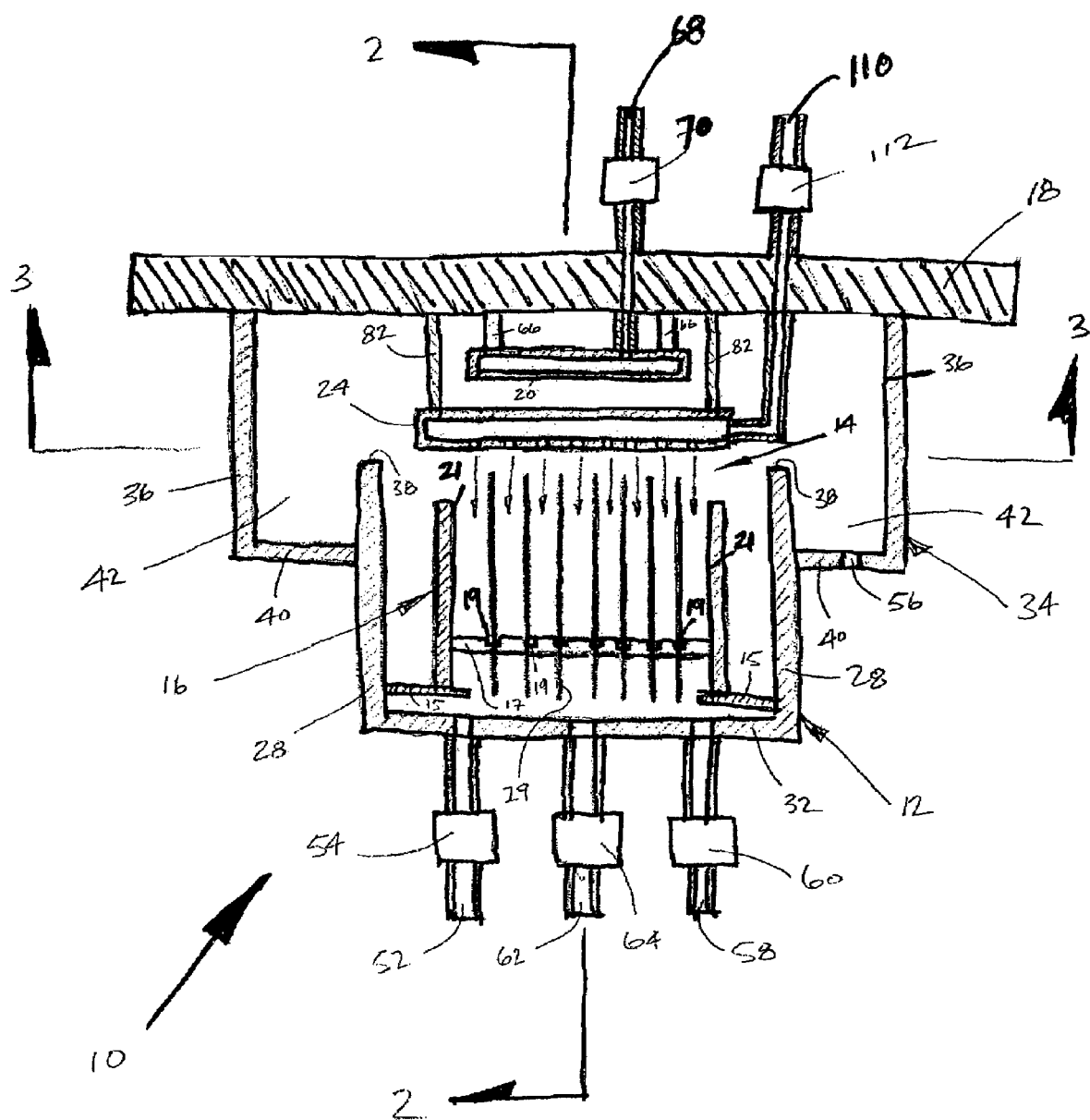
FIG. 1 is a schematic view in cross-section of an immersion apparatus in accordance with the present invention showing a set of microelectronic devices supported within an immersion vessel of the immersion apparatus, wherein the microelectronic devices are subject to a gas environment, in particular for drying.
Figure 2:
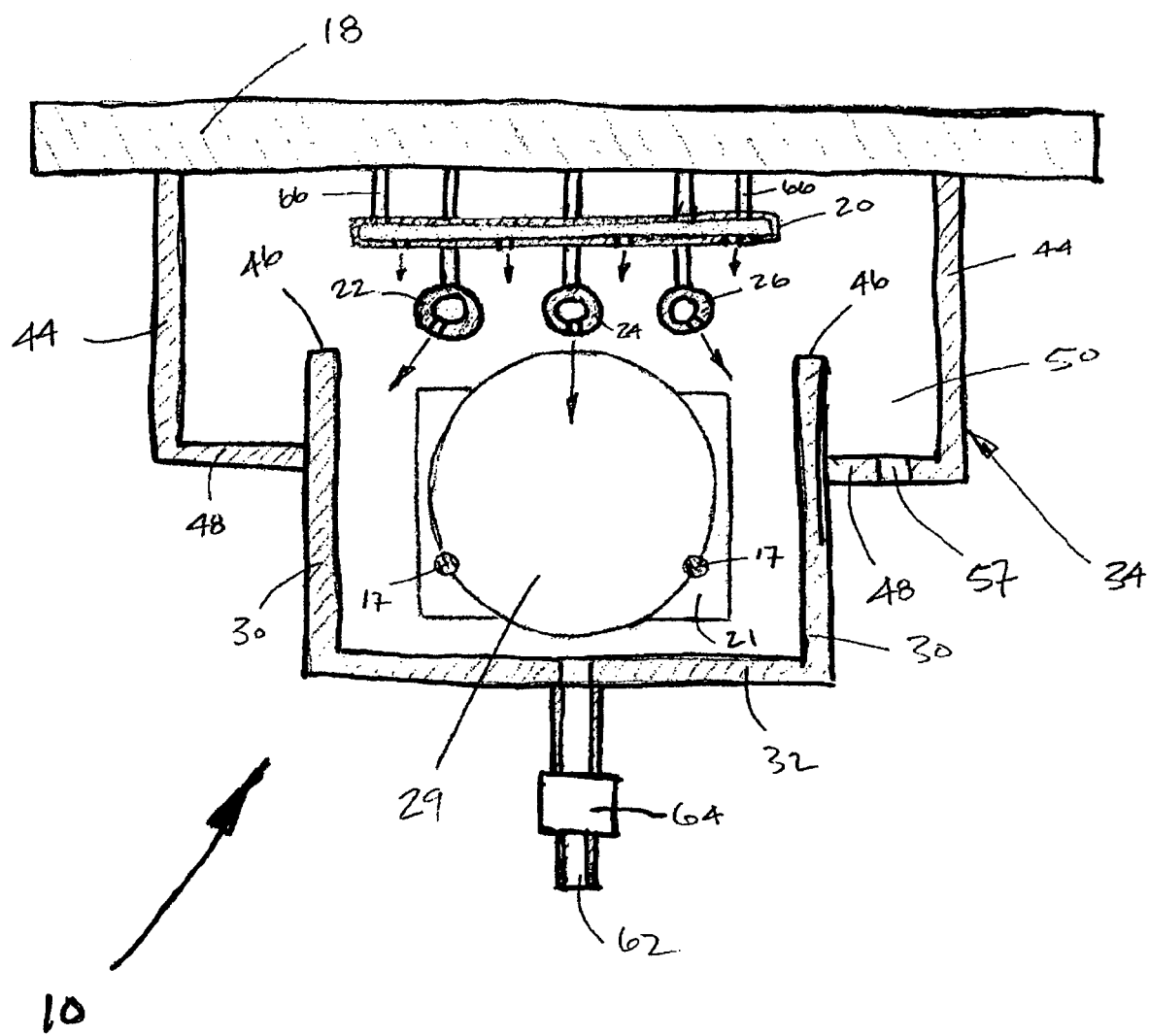
FIG. 2 is a cross-sectional view of the immersion apparatus of FIG. 1 taken along line 2—2 of FIG. 1.

With reference to the accompanying Figures, wherein like components are labeled with like numerals throughout, and initially to FIGS. 1 and 2, an immersion processing apparatus 10 is shown. The apparatus 10 may be used for processing, rinsing, and drying of microelectronic devices, such as semiconductor wafers at any of various stages of processing, flat panel displays, micro-electrical-mechanical-systems (MEMS), advanced electrical interconnect systems, optical components and devices, components of mass data storage devices (disk drives), or the like. In accordance with a number of aspects of the present invention, the apparatus 10 provides improved rinsing/cleaning and drying capabilities for such microelectronic devices.

The apparatus 10 preferably includes an immersion vessel 12, as schematically illustrated, which is preferably capable of containing any quantity of processing liquid (not shown) as utilized for affecting or cleaning one or more microelectronic devices. The processing liquid may comprise any processing liquid to which exposure to at least a portion of such microelectronic device(s), such as microelectronic device surfaces, is desired and which processing liquid is to be delivered as an immersion or liquid bath type process and that may be controllably caused to flow with respect to the microelectronic devices. As one example, processing liquid may comprise an active processing fluid such as an etchant, which could be an HF solution, a buffered HF solution, an HCl solution, or the like. As another example, processing liquid may comprise a passive processing fluid such a rinsing fluid, which could be DI water or the like. More preferably, processing liquid may comprise ultra-purified DI water, such as may be obtained by a filtering system described in commonly owned U.S. Pat. Nos. 5,542,441, 5,651,379 and 6,312,597 to Mohindra et al., the entire disclosures of which are incorporated herein by reference. Thus, in one exemplary process in accordance with the present invention, microelectronic devices may be etched by a first processing liquid, rinsed by a second processing liquid, and then subsequently dried by a drying gas after being separated from the rinsing liquid. Such etching and/or other processing steps can be conducted within a same or different immersion vessel as systems for moving microelectronic devices between vessels are well known.

The apparatus 10 preferably comprises the ability to support one or more microelectronic devices within the immersion vessel 12. For, example, a set of microelectronic devices 14 is shown positioned entirely within the immersion vessel 12 and supported therein by a microelectronic device support device or cassette 16. As shown, the cassette 16 is preferably positioned and supported within the immersion vessel 12 by a support structure 15, which may comprise one or more elements providing a support floor spaced above the vessel bottom. Preferably, the apparatus 10 further includes a removable lid 18 to permit selective access to the inside of vessel 12 and a controlled environment in vessel 12 when the lid 18 is closed. Also illustrated is an exemplary arrangement for providing one or more gas outlet devices. The illustrated arrangement includes a nozzle 20 for supplying a cleaning enhancement substance and gas for replacing a liquid environment with a gas environment, as described below, while a plurality of other gas distribution devices 22, 24, and 26 are provided for controlled delivery of a drying gas flow, preferably in the pattern of flow curtains as described below and/or for supplying a cleaning enhancement substance, as also described below. Any one or each of gas distribution devices 22, 24 and 26 can be used to provide gas in accordance with all aspects of the present invention as described below. Moreover, the devices 22, 24 and 26 can be modified in size, shape, and functional gas delivery aspects based merely upon the ability to deliver gases as described below, although certain design features are preferred for directing gas flow, such as for drying purposes, also described below.

A typical microelectronic device is illustrated throughout the figures as a wafer having first and second major, generally oppositely facing, surfaces. Microelectronic devices and wafers may comprise semiconductor materials, such as silicon and gallium arsenide, insulator materials, such as sapphire, quartz, and glass, metallic materials, such as copper for example, or combinations thereof such as silicon-gallium arsenide hybrid substrates. Microelectronic devices may further include substrates for hybrid microelectronics manufacture such those formed from ceramics or the like. Certain microelectronic devices, such as semiconductor wafers or other microelectronic devices (or substrates), are preferably processed in sets of twenty-five, fifty, or fifty-two microelectronic devices, which are usually delivered to a microelectronic device processing system together in a transfer device. A set of microelectronic devices may be transferred from any such transfer device or provided directly instead to a process carrying device, such as a cassette 16, for processing in any of a number of processing systems. Although the principles of the present invention may advantageously be applied a set of microelectronic devices, the principles of the present invention may by applied to any number of microelectronic devices, including a single microelectronic device.

The cassette 16 may be any cassette or support device capable of supporting one or more devices, such as the illustrated set of microelectronic devices 14. For example, microelectronic device edge supporting systems and methods that may or may not utilize cassettes can be used alternatively such as is described in co-pending U.S. patent application Ser. No. 10/292,807, entitled "Semiconductor Microelectronic device Cleaning Systems and Methods," and filed on Nov. 11, 2002, the entire disclosure of which is incorporated by reference herein, and which is commonly owned by the assignee of the present invention.

The cassette 16 can be movable between locations such as by a robot or the like. Alternatively, the cassette 16 may instead be a support structure of the immersion vessel 12 within which microelectronic devices may be loaded into and out of the cassette 16 by a robot or the like from another cassette or carrying device. Also, the cassette 16 may be attached to a lifting device (not shown) for moving the cassette 16 in and out of the immersion vessel 12 and may be loaded and unloaded by a robot, for example. A microelectronic device processing system need not use cassettes at all, but may instead move one or more devices around with other handling mechanisms, which mechanisms may include device support structure or may place such devices within support structure of the process equipment, such as within a vessel of an immersion apparatus.

For the purpose of illustration, a cassette 16 is shown comprising two substantially parallel rods 17, each rod 17 having plural spaced notches 19 for receiving microelectronic devices 14 to be supported together with a pair of end members 21 positioned at the ends of the rods 17. The parallel rods 17 can be spaced apart such that substantially planar objects, such as semiconductor wafers, can fit between the rods 17 and rest in the spaced notches 19 in the rods 17. As such, microelectronic devices can be held in place by gravity, although other clamps, mechanical devices or the like can also be provided. Typically, a set of microelectronic devices, as supported by the cassette 16, are regularly arranged along a central axis of the microelectronic devices and are regularly spaced apart from one another so that device major surfaces are substantially parallel to each other.

Preferably, the cassette 16 or other support structure is also designed to accommodate desired fluid flow requirements in accordance with the present invention. In particular, the cassette 16 is preferably designed to minimize any fluid build up or accumulation that might occur at contact points between support structure of the cassette 16 and the microelectronic devices carried by the cassette 16. For processing effectiveness, it is preferable that each microelectronic device be sufficiently spaced from adjacent microelectronic devices to allow an adequate flow of the various processing and rinsing solutions to provide substantially uniform surface treatment to relevant surfaces of each microelectronic device. In addition, it is also preferable that the microelectronic devices be supported close to its outer perimeter throughout the various processing and rinsing steps in order to provide the processing and rinsing fluids with substantially unobstructed access to the critical surfaces of each microelectronic device. Current microelectronic device processing guidelines allow for handling within the outer 3 mm of each microelectronic device, as such area is considered to be the unusable portion of the microelectronic device and is often referred to as the exclusion zone of the microelectronic device. To provide additional usable area of each microelectronic device, it may be desirable to further limit handling of microelectronic devices even closer to its edges, such as the outer 1 mm of each microelectronic device, for example.

The exemplary immersion vessel 12 of FIGS. 1–9 is designed, in accordance with one aspect of the present invention, to accommodate one or more microelectronic device processing, such as for processing of a set of microelectronic devices 14. In FIG. 2 the major surface of one microelectronic device 29 of the set of microelectronic devices is illustrated. As illustrated, immersion vessel 12 can be generally rectangularly shaped in cross-section for accommodating the set of microelectronic devices 14, but may be any size and shape for accommodating one or more microelectronic devices of any size and shape. For single device processing, vessel size can be reduced significantly to reduce fluid usage. Preferably, for single device or any size set of device processing, the vessel is sized and shaped to reduce or minimize process fluid usage, balanced with the functional ability to provide sufficient and effective process fluid flow to relevant device surfaces.

Specifically, the illustrated immersion vessel 12 comprises a pair of spaced side walls 28, a pair of spaced end walls 30, and a bottom wall 32. The side, end, and bottom walls 28, 30, and 32, respectively, and the materials that make up all components within vessel 12 may comprise any material suitable for a particular processing liquid application, and may be formed of any number of separate components or as components integral with one another. The side and end walls 28 and 30 are preferably dimensioned to accommodate the height of a processing liquid required to cover the relevant portion of the one or more microelectronic devices 14 suspended or otherwise supported within immersion vessel 12. Further, the side and end walls 28 and 30 are preferably formed to provide whatever fluid flow requirements are needed to permit sufficient processing liquid to flow with respect to the set of microelectronic devices 14. With other shaped vessels, the number, size and shape of the walls defining a containment vessel can vary greatly.

In accordance with an immersion process of the present invention, such as a processing or rinsing step, it is preferable to flow processing liquid through the immersion vessel 12 past the set of microelectronic devices 14. To controllably do this, a cascade rinser may be provided comprising the immersion vessel 12 as an inner vessel along with an outer vessel 34 or other containment structure for collecting cascaded process fluid from the inner vessel. Alternatively, process fluid can be simply cascaded to whatever environment surrounds vessel 12, as may be appropriate depending on process fluid handling needs. An outer vessel 34 or containment structure may completely surround immersion vessel 12 or it may be provided only along one or more portions of the immersion vessel 12. In accordance with the illustrated embodiment, an outer vessel 34 comprises outer side walls 36 that extend higher than top edges 38 of side walls 28 and which are operatively connected to outer surfaces of the side walls 28 by bottom wall 40 to create a weir structure for controllably receiving process fluid from the inner vessel 12. The outer side walls 36 may be operatively connected to the side walls 28 at or below the top edges 38 by any conventional or developed connection or integral making technique. This design permits fluid flow over the top edges 38 and into channels 42 that are preferably created between top portions of side walls 28 and the outer side walls 36. The embodiment illustrated in FIGS. 1 through 9 also includes outer end walls 44 (see FIG. 2) that along with top edges 46 of end walls 30 connect with bottom wall 48 to define channels 50 as additional weir structure.

In the illustrated embodiment of FIGS. 1 and 2, the top edges 38 of sidewalls 28 and the top edges 46 of end walls 44 create a controlling part of the weir structure over which processing liquid can flow. Such top edge surfaces may be flat, as shown, or may be tapered or angled down or otherwise shaped into channels 42 and 50. One or more notches or other openings may also be provided to assist in fluid flow dynamics and/or distribution along the weir structure. Where an immersion vessel 12 doesn't include an outer vessel or weir structure, cascading flow can be controlled in a similar manner by controlled flow over an edge, or flow can be effected by any fluid outlet or fluid flow control device or devices in any arrangement.

Figure 8:
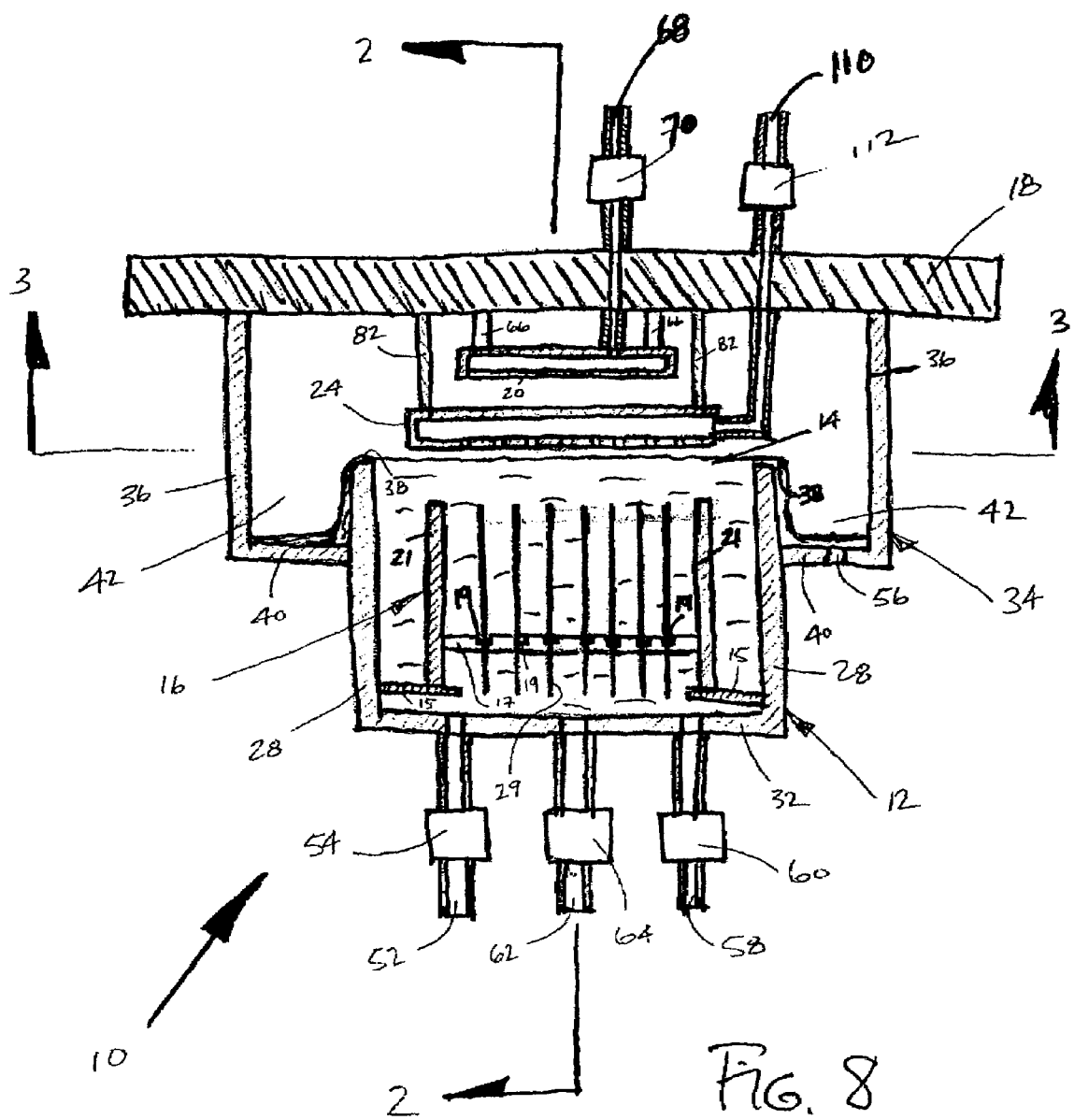
FIG. 8 is a schematic view similar to FIG. 1 showing plural microelectronic devices supported with the immersion vessel while the microelectronic devices are subject to a liquid bath environment.

For supplying processing liquid, one or more inlets, such as liquid inlet 52 permits fluid communication from a processing liquid source (not shown) into the interior of the immersion vessel 12. Such liquid inlet may be provided at the bottom (as shown) or anywhere along the sidewalls or from the top so long as process flow requirements are met based upon any desired application. Preferably, the liquid inlet 52 includes a valve 54 for controlling the flow of such liquid into the immersion vessel 12. Processing liquid is supplied via the liquid inlet 52 until the immersion vessel 12 is filled with processing liquid suitable to cover the relevant microelectronic device surfaces for treatment. As a cascade vessel, such as is illustrated in FIG. 8, liquid is supplied preferably completely up to its sidewall top edges 38 and 46. As continued processing liquid is supplied, liquid will spill or cascade over the top edges 38 and 46 into the channels 42 and 50. Bottom walls 40 and 48 of the outer vessel 34 help define the width of channels 42 and 50, and also provide space to accommodate liquid drains 56 and 57 formed in bottom walls 40 and 48 respectively of the outer vessel 34. If desired, the channels 42 and 50 may each include an outer vessel liquid drain 56, which drains themselves can be provided in any conventional or developed way depending on the desired fluid flow characteristics. The drains 56 and 57 may also permit gas flow, such as from the nozzle 20 and/or gas distribution devices 22, 24, and 26 to exit from the apparatus 10. Where other or no containment structure is provided, drains may be unnecessary.

After the set of microelectronic devices 14 is processed and/or rinsed, it is desirable in accordance with one aspect of the present invention to remove or separate the one or more microelectronic devices 14 from the liquid environment and progressively introduce the set of microelectronic devices 14 (or any portion thereof subjected to liquid bath or immersion treatment) to an environment containing gas. Separation thus can be characterized as the gradual replacement of the liquid environment surrounding the microelectronic devices 14 with a gas environment. Such a gas containing environment need not be completely gas, but it preferably is also extremely clean and contains only gases that will not adversely affect the set of microelectronic devices 14 or that can enhance clean separation, as will be described below.

Draining of processing liquid from the immersion vessel 12 effectively separates the set of microelectronic devices 14 from the processing liquid. The immersion vessel 12 is preferably drainable for removing processing liquid at any desired time by way of at least one immersion vessel drain 58, which preferably includes an adjustable flow valve 60 for controlling the drain rate of the immersion vessel 12. Also, the immersion vessel 12 may preferably include a quick dump drain 62, controllable by a valve 64 that may be used to provide fast removal of processing liquid from the immersion vessel 12 when desired. That is, it may be desirable to drain the processing liquid to a point below the set of microelectronic devices 14, such as to the floor support 15, at a controlled rate by way of the drain 58 and then quickly remove the remaining processing liquid with the quick dump drain 62 accordingly. During drainage of the immersion vessel 12, the cascading effect (if provided for) would cease. It is noted that liquid inlet 52, drain 58, and quick dump drain 62 may be provided separately or combined together as desired by using any known or developed arrangement of plumbing, valves, fluid handling devices, or the like.

Preferably, the drain rate with respect to the microelectronic device surfaces is accurately controlled. For microelectronic devices, drain rate can be stated as a function of the rate that the gas environment replaces the liquid environment as experienced across a vertical surface (whether such a surface actually exists or not). For the purpose of obtaining better separation, it is preferable that the gas environment replaces the liquid environment at a rate of around 5 mm per second or less. Preferably, the gas environment should replace the liquid environment at a rate of 2 mm per second or less. The rate of replacement can be controlled easily by controlling the flow of liquid from the immersion vessel 12, such as by utilizing a variable and controllable valve device as drain valve 60. Alternatively, the liquid environment can be removed by other conventional or developed liquid transfer mechanisms utilizing gravity, positive pressure, siphons, or like.

Preferably, the gas environment replaces the liquid environment at a substantially constant rate while the replacement passes across the microelectronic devices. However, it is contemplated that the replacement rate can be varied if desired. Preferably also, after the replacement passes the microelectronic devices, such as when the liquid level falls below the support structure 15, described above, the speed of drain can be increased, by either varying the opening of the drain valve 60 and/or opening the dump valve 64. Preferably, the dump valve 64 is fully opened to remove the remaining liquid quickly once the liquid level falls below the microelectronic devices.

Alternatively, the set of microelectronic devices 14 may be separated from a processing liquid by a lifting type separation. That is, for certain applications, the cassette 16 or other support device for one or more microelectronic devices 14 can be raised from a processing liquid by a lifting mechanism or device such as a robot or the like. Such a lift mechanism may comprise any known or developed system suitable for gripping the cassette 16 or microelectronic devices and moving them in and out of the interior space of the immersion vessel 12. To accommodate a lifting mechanism of any type, sufficient head space below lid 18 would be provided within which the microelectronic devices could be positioned, and such mechanism could be located within the head space too or it could pass through such lid or other closure structure with appropriate accommodation.

It is also contemplated that microelectronic device separation could be conducted by any combination of lifting of microelectronic devices and draining of processing liquid. Additionally, each of the inlet and drains discussed above may be controlled by any conventional or developed valve mechanisms and/or and further controlled by any conventional or developed control systems for controlling fluid flow into and out of the immersion vessel 12 and outer vessel 34 (or plural portions thereof). With either a lift separation or combination of lift and drain separation, it is preferable, as above to control the separation rate for enhanced separation of liquid from the microelectronic surfaces.

Figure 9:
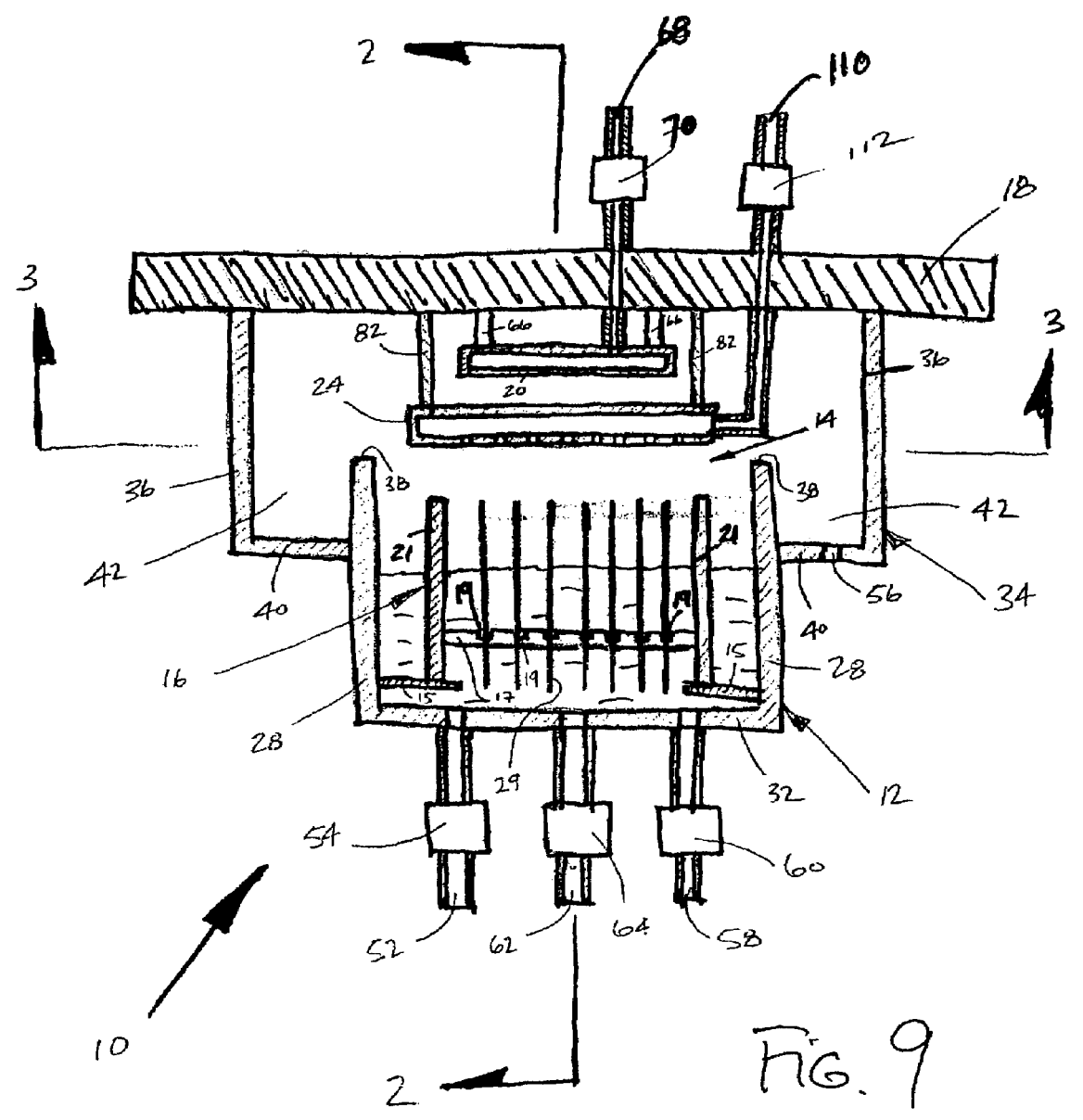

In accordance with another aspect of the present invention, it is preferable to introduce a cleaning enhancement substance into the gas environment for enhancing the process liquid flow from surfaces of the microelectronic devices of the one or more microelectronic devices 14 during a separation step as illustrated in FIG. 9. The cleaning enhancement substance provides for enhanced removal of liquid from the surfaces of the microelectronic devices through a concentration gradient or mass transfer effect, e.g., Marongoni flow (described above in the Background). This effect tends to increase or accelerate the flow of liquid from surfaces of a microelectronic device. The use of known cleaning enhancement substances carried in the gas environment affects the liquid meniscus on the microelectronic device surface as separation between the device surface and the liquid occurs to reduce surface tension of the liquid attached to the microelectronic device surface, thereby increasing fluid flow therefrom. The cleaning enhancement substance is also believed to dope or mix within the liquid attached to the microelectronic device surface, which mixing occurs in accordance with a gradient of the concentration of the cleaning enhancement substance in the attached liquid to accelerate fluid flow of the attached liquid off of the microelectronic device surface. That is, the cleaning enhancement substance will be present at a higher concentration within the liquid at the thinner upper region of each meniscus that forms as a result of the separation process (the relative movement of the device surface with respect to the liquid tending to drag the liquid with the surface) than at a lower region thereof, the effect of which is the creation of the concentration gradient. The tendency for the doped or higher concentration liquid with cleaning enhancement substance to move toward liquid of lower concentration is the Marongoni effect, which effect is advantageous in removing liquid from microelectronic device surfaces. This fluid flow can also assist in pulling or drawing off particles from microelectronic device surfaces.

Certain tensioactive compounds are known or may be developed for affecting the surface tension between the microelectronic device surfaces and processing liquid at the interface of any microelectronic device surface, the processing liquid surface and the gas environment. Such tensioactive compounds can be provided easily within the replacement gas environment either as gas or as liquid droplets atomized or the like within the gas or may be delivered as liquid to the process liquid surface. A preferred example of such a tensioactive compound that may be delivered in gas or vapor form or as a liquid is isopropyl alcohol ("IPA").

Other examples of suitable tensioactive compounds include ethyleneglycol, 1-propanol, 2-propanol, tetrahydrofuran, 1-butanol, diacetone alcohol, 2-ethoxy-ethanol, 1-methoxy-2-propanol, acetone, n-butyl acetate and hydrofluoroethers that have been more recently developed. Tensioactive compounds may be delivered in many physical forms, and by many methods, e.g., in gas form, as a gas in a carrier gas, as a liquid, as an aerosol in a carrier gas or as an aerosol introduced directly into the process vessel. The cleaning enhancement substance is preferably delivered as a gas (with or without a carrier gas). Methods for adding a cleaning enhancement substance to a carrier gas are described in commonly owned U.S. Pat. No. 5,772,784 to Mohindra et al., the entire disclosure of which is incorporated herein by reference.

Figure 3:
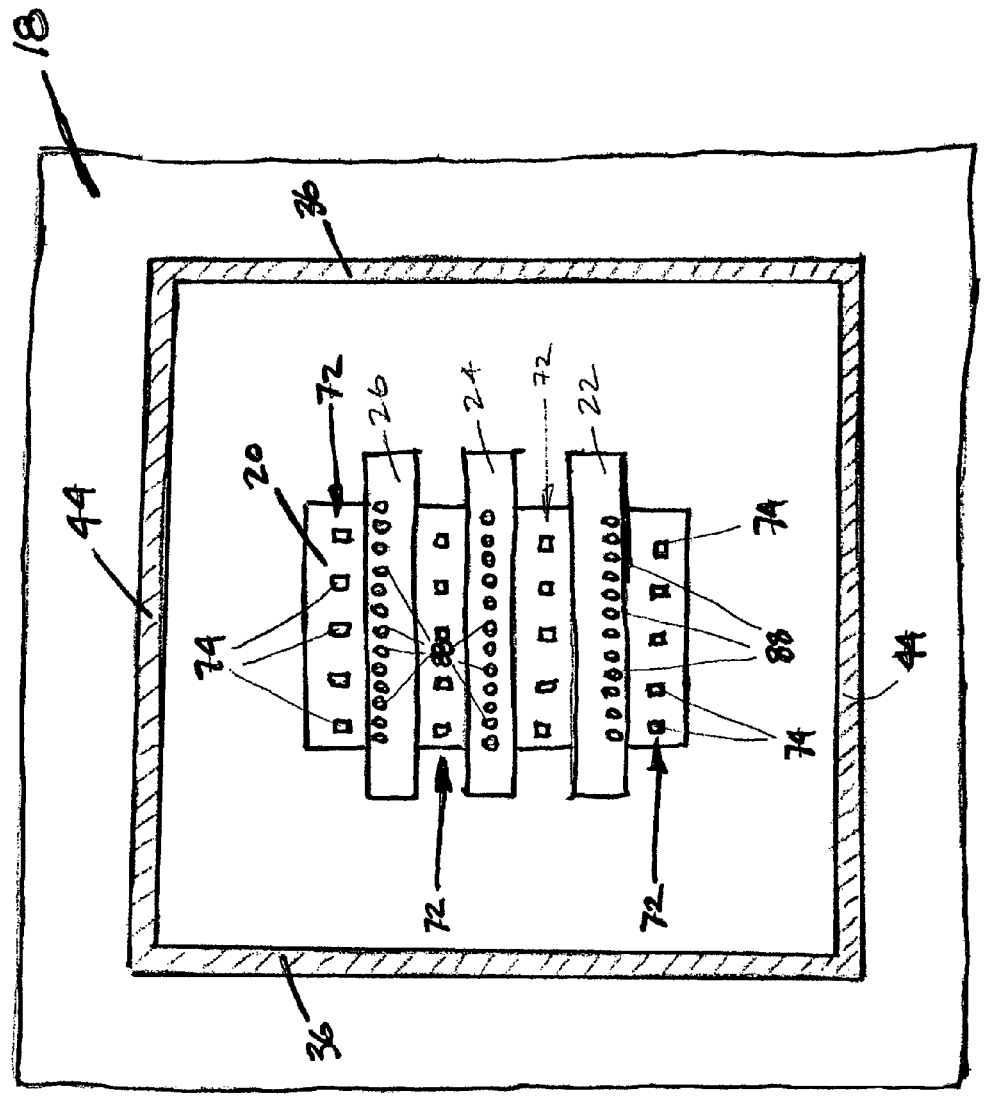
FIG. 3 is a cross-sectional view of the immersion apparatus of FIG. 1 taken along the line 3—3 and showing one preferred gas control arrangement having a nozzle of the present invention for delivering a cleaning enhancement substance to the immersion vessel and three gas distribution devices of the present invention for directing drying gas flow curtains to the set of microelectronic devices positioned within the immersion vessel.

A cleaning enhancement substance of the type described above can be delivered to the immersion vessel 12 by a nozzle 20, one or more of the gas distribution devices 22, 24, and 26, or any combination thereof. As shown in FIG. 3, nozzle 20 can be provided with one or more orifices 74 in any desirable arrangement. Likewise, the illustrated gas distribution devices 22, 24, and 26 include orifices 88, which are described in detail below. In one embodiment, a cleaning enhancement substance can be supplied from a cleaning enhancement substance source, discussed below, to the nozzle 20 by an inlet 68, can also include a controllable valve 70, or the cleaning enhancement substance can be supplied to one or more of the gas distribution devices 22, 24, and 26 by a supply inlet 110, which preferably includes a controllable valve 112. It is contemplated that each of the gas distribution devices 22, 24, and 26 may have an individual gas supply or they may be commonly supplied by using any known or developed gas handling techniques or devices.

If used, the nozzle 20 can be operatively mounted to the lid 18, such as by mounting structures 66 as shown in FIGS. 1 and 2. As shown in FIG. 3, the nozzle 20 also may include plural rows 72 of the orifices 74 for controlled delivery of a cleaning enhancement substance to the immersion vessel 12. The nozzle 20 is preferably designed such that it is capable of substantially uniformly delivering cleaning enhancement substance within a gas environment as such replaces a liquid environment about the microelectronic devices 14. As shown, the nozzle 20 is illustrated as a plate that extends in length and width to cover the set of microelectronic devices 14. Although the nozzle 20 is illustrated as a generally rectangular plate, the nozzle 20 may alternatively be formed as having any shape, such as a disk or showerhead or the like. Generally, it is preferred that the nozzle 20 is to cover at least a portion of the set of microelectronic devices 14 and preferably to cover an entire set. The nozzle 20 may comprise a single nozzle, as illustrated, or may comprise any number of distinct nozzles having one or more delivery orifices for introducing cleaning enhancement substance as described above.

Cleaning enhancement substance is preferably provided during the entire period over which the liquid environment is replaced by a gas environment with respect to the one or more microelectronic devices supported within vessel 12. This replacement process being facilitated by gas flow into the vessel 12 from any one or more of nozzle 20 and/or gas distribution devices 22, 24 and 26, as provided, and which gas flow can be controlled based upon the desired gas pressure within vessel 12 and as affected by the rate of removal of the liquid environment.

Depending on the specific application, however, it may be desirable to introduce cleaning enhancement substance over less time than the full replacement step with respect to the relevant microelectronic device surfaces. Furthermore, it may be desirable to introduce such cleaning enhancement substance over a greater time period than the full replacement step. For example, it is preferable to continue to dispense cleaning enhancement substance beyond when the liquid level falls below the bottom of the microelectronic devices as supported within the vessel. As noted above and described in greater detail below, liquid sometimes accumulates at contact points between the support structure of the microelectronic devices within the vessel and the edges of the microelectronic devices. By continuing cleaning enhancement substance flow after the liquid level is below the microelectronic devices, accumulated or trapped liquid at such contact points tends to be better contained at those contact points. That is, drops that are formed at contact points have less of the tendency to migrate from where there are formed. This is due to the tensioactive nature of the cleaning enhancement substance as it affects the contact angle of the liquid relative to the device surface. As noted above, it is preferable to quickly drop the remaining liquid level via a quick dump during which period, the cleaning enhancement substance is preferably still dispensed into the gas environment. Then, as described below, a drying operation can be commenced quickly after the liquid is gone (or even before) so that any accumulated drops or liquid film portions can be more quickly dried with less opportunity to migrate to greater areas. If the contact points are effectively controlled at the microelectronic device edges, or the exclusion zone adjacent the edge, the continued cleaning enhancement substance flow can effectively help minimize potential contamination onto the usable surfaces of the microelectronic devices. It is contemplated that cleaning enhancement substance be delivered for a minute or longer to the gas environment within the vessel after the liquid level is below the microelectronic devices in order to effectively contain potential liquid drops or films at such contact points. Such time may be shorter or even longer based upon specific operation parameters and upon the operation of the drying step described below, if conducted. It is preferable that the cleaning enhancement substance flow be continued even into the drying operation. It is contemplated that such cleaning enhancement substance delivery can be effected as an independent operation by providing cleaning enhancement substance (as gas or liquid) into the vessel 12 or as a combined operation with other gas delivery, such as carrier gas, replacement gas, or drying gas.

Another aspect of the present invention relative to the controlled flow of cleaning enhancement substance with the gas environment replacement of the liquid environment is to vary the flow or concentration of cleaning enhancement substance into the gas environment. That is, flow rates or different gas concentrations of cleaning enhancement substance can be varied according to select stages or continuously over periods or all of the separation process. When the immersion vessel 12 is drained because the separation as described above at the desired rate of replacement, the flow rate of cleaning enhancement substance can be increased, for example, as the liquid level becomes lower within the vessel 12. The flow of replacement gas in addition to the cleaning enhancement substance can also be controlled to accommodate adequate gas input as part of the replacement process. Flow rates can be varied in accordance with a stepped profile, a continuous or sloped profile, or combinations thereof over the separation process or any portion thereof. Variances of flow rates can an increase, decrease, or mix thereof, and may be done in conjunction with concentration variations of the cleaning enhancement substance. Variations of the cleaning enhancement substance may also be done independently from flow rates.

According to one preferable process technique, gas and cleaning enhancement substance flow is minimized when the liquid level is high within the vessel 12 in order to minimize rippling of the liquid surface and any influence on surface flow of the liquid. As a level drops, however, flow rates may be increased at one or more times in order to ensure sufficient delivery of cleaning enhancement substance to the liquid top surface and thus the menisci that are formed at surfaces of the microelectronic devices and to effectively replace the liquid environment with gas. The concentration of the cleaning enhancement substance over such flow changes can be the same or varied as well over time. It is contemplated that the flow rates of the cleaning enhancement substance can be increased or decreased as stages or as a gradual continual process depending on a desired effect. It is preferable, however, to increase flow of cleaning enhancement substance into the gas environment as the liquid level lowers for adequate substance delivery and effectiveness of the cleaning and rinsing operation. For potential time periods after the level falls below the microelectronic devices, it is contemplated that the cleaning enhancement substance flow rate can be increased or decreased based upon a particular process and as empirically determined or otherwise predicted for the purposes discussed above in containing droplets at contact points.

Figure 10:
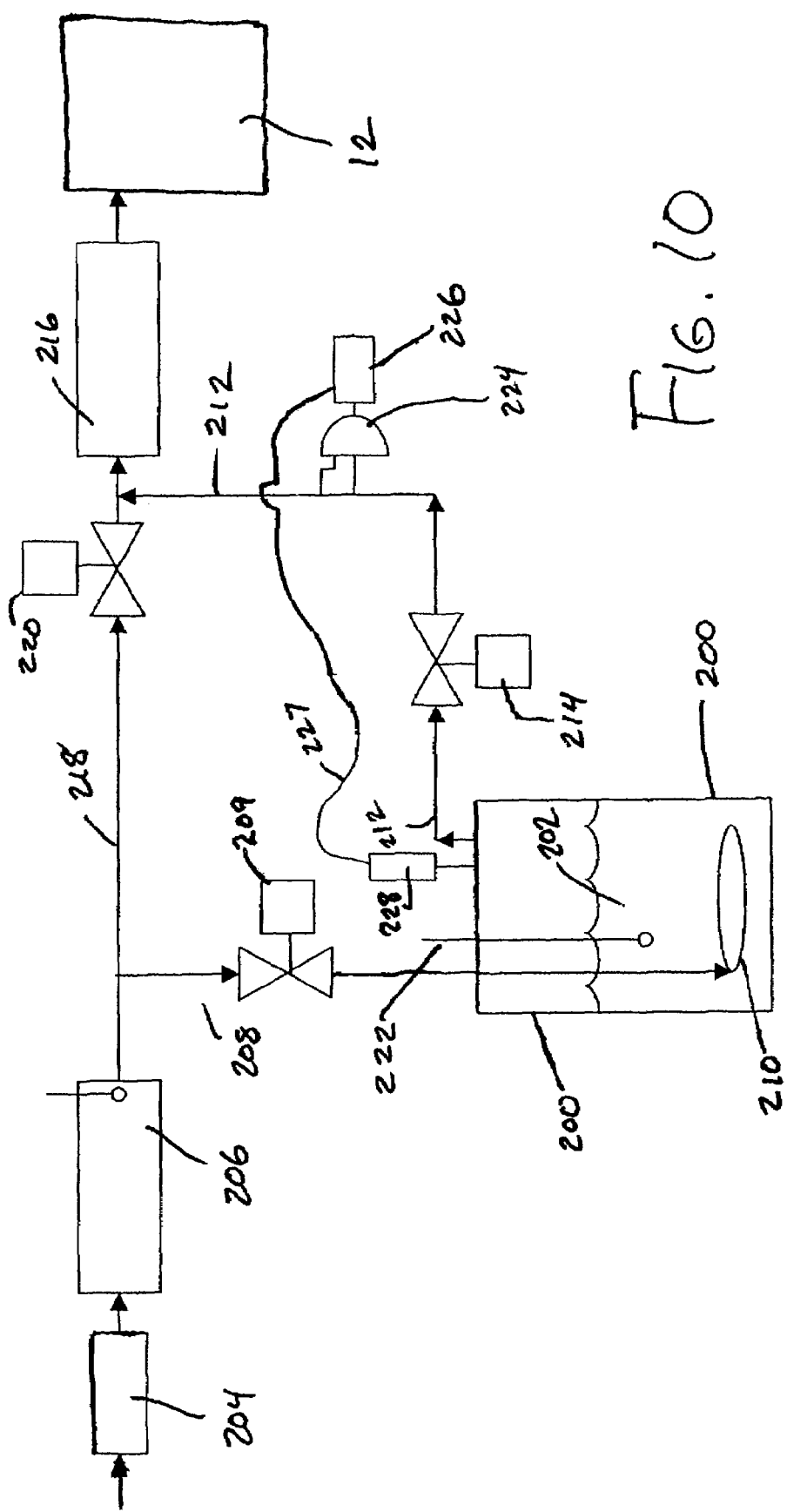
FIG. 10 is a schematic view showing fluid flow and control aspects of a system in accordance with another aspect of the present invention for supplying cleaning enhancement substance to an immersion vessel.

As part of the delivery process of the cleaning enhancement substance, FIG. 10 illustrates a provision of the cleaning enhancement substance at a desired concentration. Specifically, clean gas, such as ultrapure nitrogen (or any other preferably ultrapure, inert gas) is utilized to pick up cleaning enhancement substance for delivery to the interior of the vessel 12. Alternatively, atomized liquid cleaning enhancement substance can be introduce directly into the vessel 12, or cleaning enhancement substance in liquid form can be dispensed onto the process liquid. Preferably, clean nitrogen gas is passed through a bubbler vessel 200 containing a quantity of cleaning enhancement substance 202, such as IPA. The clean gas can be hot or cold and supplied at various rates depending on the amount of cleaning enhancement substance to be picked up by the gas flow.

Specifically, in FIG. 10, an exemplary system is illustrated including a nitrogen supply 204 cleaning to a nitrogen heater 206 that is connected by way of line 208 to a gas ring or sparger 210 with holes so that temperature controlled nitrogen flows substantially from the bottom of the bubbler vessel 200 up through the volume of IPA 202. As result of this operation, IPA vapor is carried with the nitrogen gas flow through further line 212 and preferably through a on/off type control valve 214 for delivery to the interior of the immersion vessel 12, preferably through a further gas filter device 216. FIG. 10 also shows the nitrogen supply 204 connectable alternatively through the nitrogen heater 206 with a delivery line 218 preferably connected by way of a variably controlled bypass valve 220 to the interior of vessel 12, again preferably through gas filter 216. That way, clean nitrogen gas flow can be delivered through the illustrated system through the bypass circuit including alternative delivery line 218 or through the bubbler vessel 200 independently from one another as controlled by the control valve 214 and bypass valve 220. It is contemplated that either manner may be utilized solely at any given time or that gas can be delivered through both subsystems together at controlled ratios in order to achieve desired gas flow rates and concentrations. Moreover, as described above, independent or combined gas and IPA delivery can be to any one or more of nozzle 20 and devices 22, 24, and 26.

Another important aspect in affecting concentration of cleaning enhancement substance, in particular, is controlling how much cleaning enhancement substance vapor is or will be picked up by the nitrogen gas flow through the bubbler vessel 200. The nitrogen gas can be potentially saturated with IPA vapor through the bubbler vessel 200 based in part upon gas flow rates and the volume of IPA through which the nitrogen gas flows. It is also understood that temperature and pressure affect the potential concentration of cleaning enhancement substance, like IPA, within a gas, such as nitrogen. Specifically, the temperature of the nitrogen/IPA mixture as it leaves the bubbler vessel 200 affects the amount of IPA that can be carried by the nitrogen gas. Likewise, the pressure of the nitrogen/IPA gas mixture, measured as back pressure within line 212 or head space gas pressure above the liquid IPA in bubbler vessel 200, affects such potential concentration of IPA in the nitrogen gas. Pressure and temperature of these points affect the potential concentration of IPA within the nitrogen gas based upon known principles and according to relationships that are commonly represented as curves charting temperature versus pressure as to the ability to achieve desired configurations of a desired vapor (for example) within a desired gas (e.g. a desired concentration of IPA in nitrogen at a specific temperature and pressure). It is further understood that such concentration can be controlled by controlling temperature and pressure, as the outgoing concentration of IPA within nitrogen fits such known curves.

Heat can be supplied as part of the concentration system in any number of ways including connective, conductive and/or radiant heat transfer systems. Similarly, if desired for any particular application, any type of cooling system could be utilized. For example, heat could be transferred to or from the bubbler vessel 200 directly by any such heat transfer mechanism, which heat transfer would affect the temperature of the liquid IPA and thus the concentration of the nitrogen/IPA mixture. Alternatively, as illustrated in FIG. 10, the liquid IPA could be heated (or cooled) by heating (or cooling) the nitrogen gas, such as by nitrogen heater 206, which itself can controllably heat the gas by any known or developed technique. As such, heated nitrogen gas can add heat to the system for heating the liquid IPA and thus the more important mixture of nitrogen and IPA as a concentration control. Temperature of the mixture, or any constituent part, can be monitored at any time on the basis of a correspondence to the amount of heat to be supplied by gas heater 206 as part of a feedback control to achieve desire mixture concentration. For example, if the liquid IPA temperature is too cool, as monitored by a sensor 222, the nitrogen could be introduced at an elevated temperature.

Likewise, pressure of the mixture from the bubbler vessel 200 can be monitored and controlled to achieve a desired mixture concentration of cleaning enhancement substance in gas, such as IPA in nitrogen, taking into account the machine temperature, constituent fluids and known relationships as represented by developed curves. Pressure within the headspace of the bubbler vessel 200 is dependent upon the pressure of introduction of gas into the bubbler vessel 200 and the flow rate by which the mixture is allowed to escape. Such a flow rate is controllable by any type of flow controlling by valve or orifice, such as may be variable to control a desired back pressures within line 212. Controlling back pressure in line 212 also controls the pressure within the headspace of bubbler vessel 200 and thus controllably affects the concentration of IPA within the nitrogen/IPA mixture leaving the bubbler vessel 200.

As an example for controlling back pressure effectively, a back pressure regulator 224 is illustrated in FIG. 10 that can be controlled to regulate the flow through the device based upon the monitoring of the back pressure upstream of the back pressure regulator 224. Such regulators, per se, are conventionally known as may be driven to change flow rates by a controller 226 that may be electric, mechanical, pneumatic or the like and based upon input information, such as electrical signals, provided via an electrical connection 227 from a pressure transducer 228 that is operative to sense pressure within the bubbler vessel 200, for example. Where such a back pressure regulator 224 regulates the back pressure in line 212 upstream from itself, the valve 214 is preferably a two position fully opened and closed type valve.

Whatever level of saturation the nitrogen leaves the bubbler vessel 200, that concentration can, if desired, be further controlled or manipulated by supply of additional nitrogen through line 218. In that case, the bypass valve 220 is preferably variable. Also, in any case, the concentration of IPA is preferably controlled to be at or near saturation as it will be decreased substantially within the interior of the immersion vessel 12 once introduced into the gas environment thereof, which environment at lower pressure can be provided solely by gas through a system such as that of FIG. 10 or supplemented with other gas supply.

According to preferred methods of utilizing cleaning enhancement substance as part of the separation and replacement process, cleaning enhancement substance is introduced during the entire period over which the liquid environment is replaced by the gas environment as such replacement passes across all microelectronic devices surfaces. During this operation stage, it is preferable for processing 300 mm wafers or the like to introduce the cleaning enhancement substance at a substantially even concentration of between 0.5 percent and 3.6 percent, preferably between 1.5 percent and 2.0 percent. This concentration may change significantly for microelectronic devices of different types and/or sizes. However, for 300 mm wafers of the like, it is preferable that the flow rate of the supply of nitrogen and IPA be increased in stages starting at a flow rate of between 50 slm (standard liters per minute) and 200 slm and increasing by about between 50 slm and 100 slm at between 10 and 30 seconds time intervals while replacing the liquid environment with a gas environment at a rate of between 1 and 3 nm/sec. As above, these rates and times may be changed significantly for microelectronic devices.

Then, it is further preferable to continue at about the final flow rate when the liquid level falls below the microelectronic devices while the level continues to be lowered at a controlled rate. After a short period sufficient for the level to be sufficiently away from the microelectronic devices to not potentially rewet them, the dump valve 64 is preferably opened. A continued flow of cleaning enhancement substance is still preferred, although potentially at a lower flow rate, or stages of flow rates, through the quick dump and into a drying step, if conducted, for containing liquid drops or films, such as at contact points, as discussed above.

It is also preferable to perform a step of drying after separating the set of microelectronic devices 14 from a processing liquid. The step of drying preferably substantially removes all liquid droplets adhering to certain surfaces such as microelectronic device surfaces, microelectronic device edges, carrier edges, and the like, as well as any adsorbed liquid that may be present on a microelectronic device surface. As such, the principles of the present invention may be used to dry microelectronic devices regardless of how such liquid droplets and/or adsorbed liquid is introduced to the microelectronic devices. Liquid droplets and/or adsorbed liquid can be introduced to microelectronic devices by separation from a processing liquid, spraying or rinsing, or from exposure to a humid environment, as examples.

Figure 4:
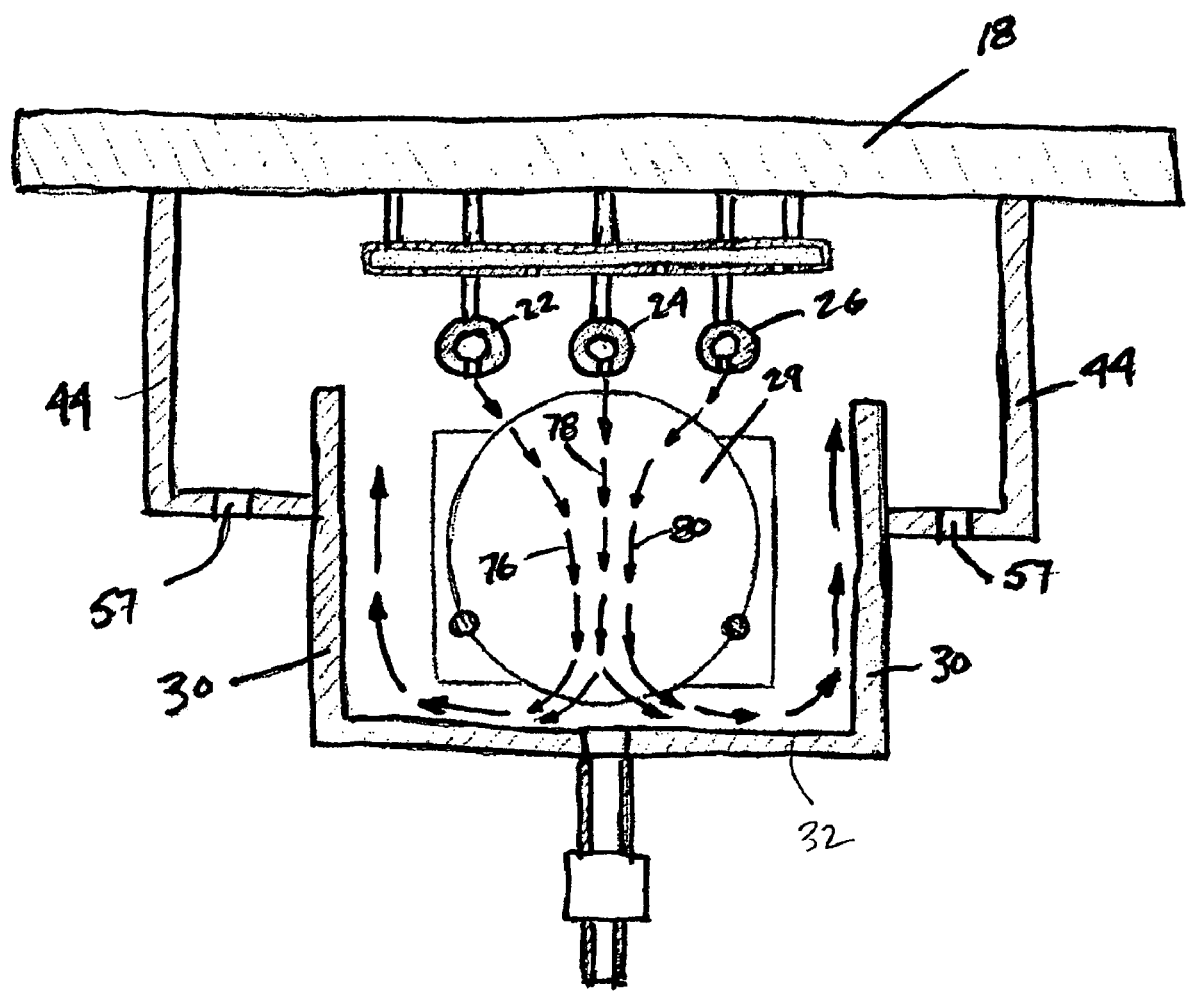
FIG. 4 shows a cross-sectional view similar to FIG. 2 additionally showing plural controllably directed gas flow curtains in accordance with one aspect of the present invention, such gas flow curtains being directed according to one exemplified flow pattern primarily toward the bottom wall of the immersion vessel by the gas distribution devices.
Figure 5:
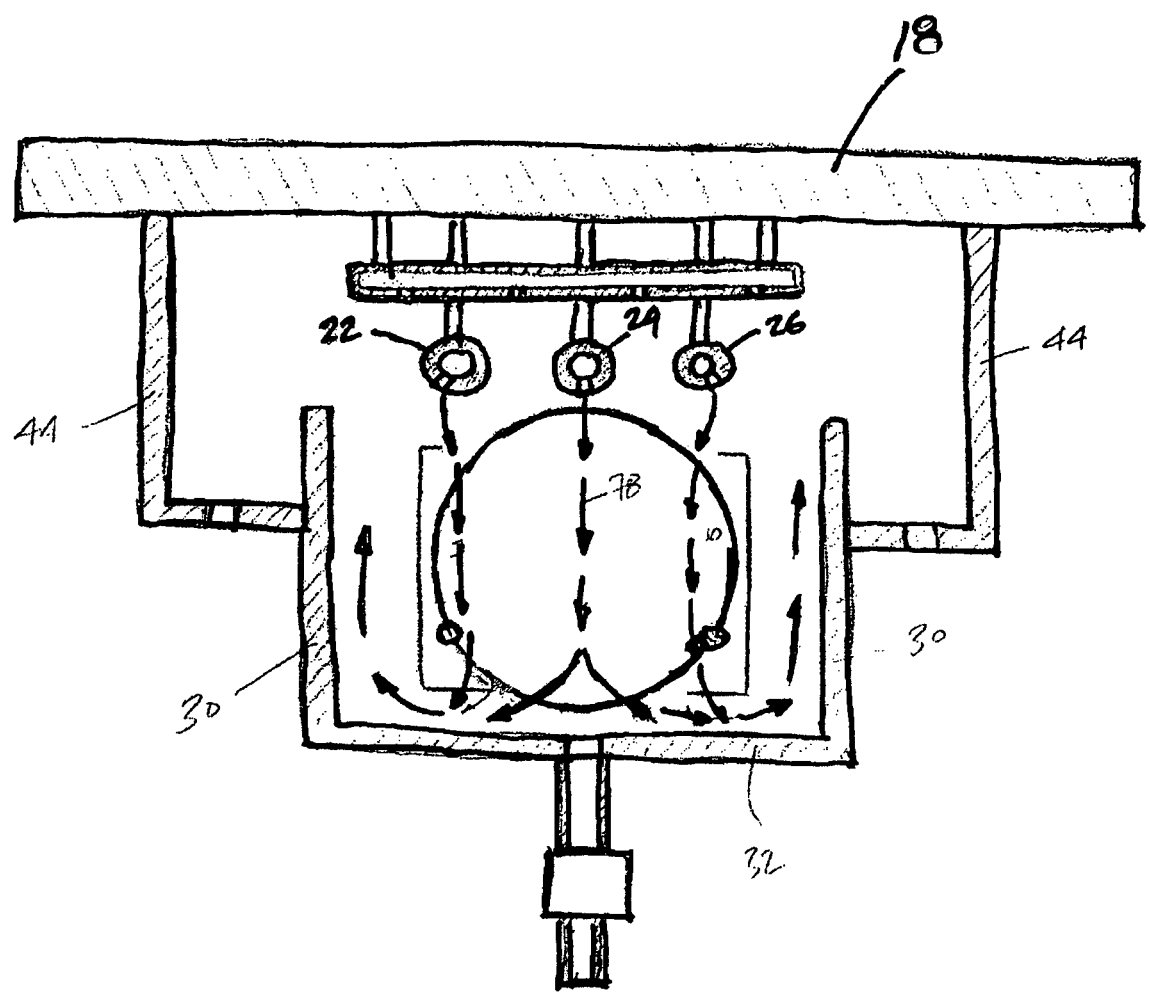
FIG. 5 shows a cross-sectional view similar to FIG. 4 but instead shows a different exemplified flow pattern for the controllably directed gas curtains that are moreso directed toward the side walls of the immersion vessel by the gas distribution devices.
Figure 6:
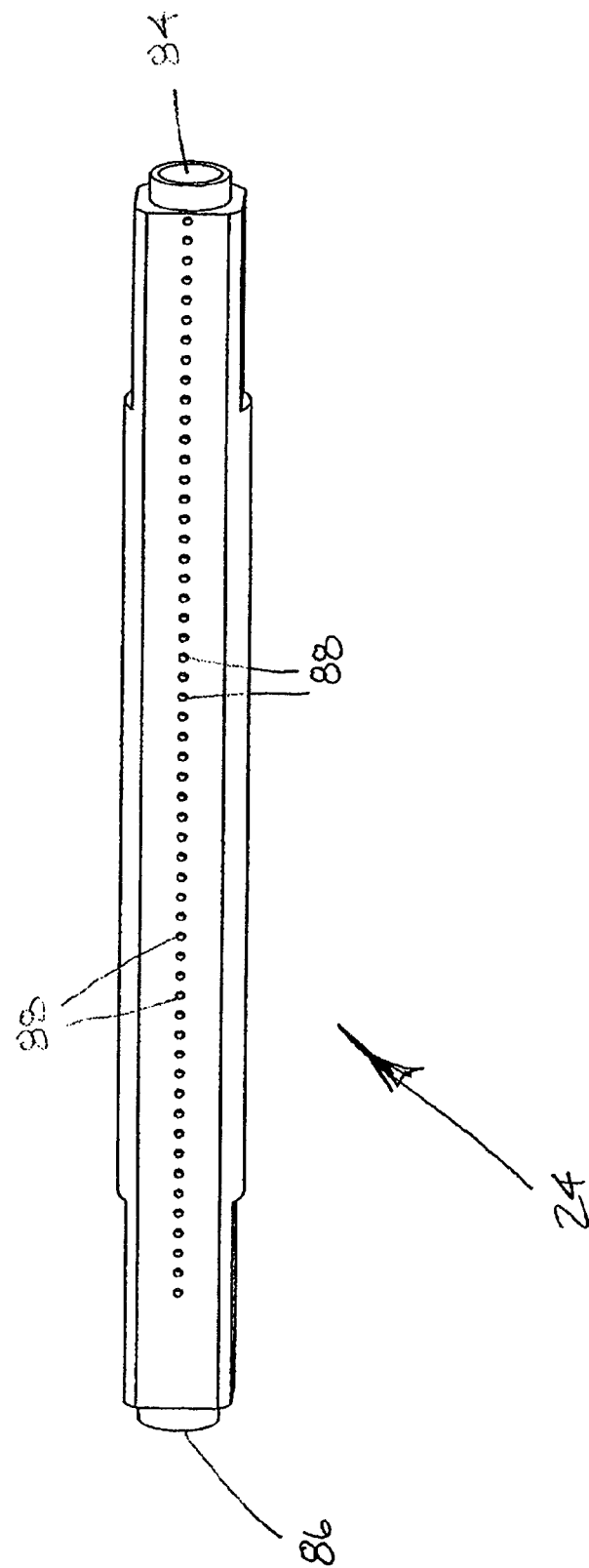
FIG. 6 is a perspective view of an exemplary gas distribution device of the present invention showing in particular plural orifices for distributing gas therefrom.

Preferably, in accordance with the present invention, the gas distribution devices 22, 24, and 26 are utilized to supply gas curtains 76, 78, and 80, respectively, as shown in FIGS. 4 and 5 and described in greater detail below. In FIG. 6 a perspective view of the gas distribution device 24 is shown as an exemplary gas distribution device in accordance with the present invention. It is noted that the gas distribution devices 22 and 26 are preferably similar to the gas distribution device 24 but need not be and may comprise any gas distribution device such that the functional aspects of the present invention are achieved. Preferably, the gas distribution device 24 is formed as a tube-like structure, as illustrated, and includes a gas inlet at a first end 84, which gas inlet is preferably connectable to a pressurized drying gas supply (not shown). A second end 86, opposite the first end 84, may also be connectable to a pressurized drying gas supply (not shown) or may be closed depending on the gas flow requirements. The gas distribution devices 22, 24, and 26 may be formed from any suitable material.

Preferably, the gas distribution device 24 includes plural circularly shaped orifices or openings 88 formed as a row of spaced apart orifices for distributing gas therefrom. The orifices 88 may be any shape such as circular, elliptical, square, rectangular, slot shaped, or the like. Preferably, the exemplary gas distribution device 24 of the present invention includes an arrangement of orifices 88 that can provide a directional gas curtain such as the gas curtain 78 of FIGS. 4 and 5. Such a gas curtain can be provided by using a row of closely spaced orifices to provide a curtain-like stream of gas flow. That is, preferably each individual stream of gas flowing from each individual orifice contributes to the overall gas flow of the gas curtain. The provision of a gas curtain made up of individual directional gas streams can be effected by using non-diverging orifices as orifices 88. Moreover, a sufficient number of closely spaced orifices 88 can enhance the creation of a gas curtain. For example, one preferred arrangement of orifices 88 may be formed as a single row of orifices, each having a diameter of about 0.04 inches and spaced apart by about 0.2 inches for 300 mm wafers with 5 mm pitch distance between wafers. Further, it is contemplated that plural rows of any desired number of orifices 88 may be used. If plural rows of orifices 88 are used, such rows may be positioned such that orifices are adjacent to each other or the rows may be arranged so that the orifices 88 are staggered or offset from each other. The orifices 88 may include any designs for the purpose of controlling the direction of gas flow from devices 22, 24 and 26 and may include different designs within one device or from one device to another.

Each of the gas distribution devices 22, 24, and 26 is preferably generally tube shaped, as shown. The gas distribution devices 22, 24, and 26 may, however, comprise any shape such that the gas curtains 76, 78, and 80 can be controllably directed with respect to the set of microelectronic devices 14 for providing adequate flow of drying gas around the set of microelectronic devices 14 and/or for introduction of other gas with or without cleaning enhancement substance. For example, the gas distribution devices 22, 24, and 26 may be square, rectangular, or plate shaped. Moreover, the gas distribution devices 22, 24, and 26 may be provided as individual devices or may be formed as a single device capable of directionally providing any desired number of gas curtains such as the gas curtains 76, 78, and 80. Additionally, it is noted that any number of gas distribution devices for providing any number of gas curtains may be used in order to achieve desired gas flow requirements such as for different size microelectronic devices, for example.

During a drying step, the gas curtains 76, 78, and 80 comprise at least drying gas. The drying gas can be any suitable gas capable of removing liquid from the microelectronic device edges, microelectronic device surfaces, and the like. The drying gas is preferably ultra-pure nitrogen and the like, but may also be a variety of other gases or gaseous mixtures that are preferably inert and ultraclean. In one preferred embodiment, the drying gas is heated ultra-pure nitrogen. Such drying gas may preferably be heated so that it enters the chamber of vessel 12 at a temperature of about between 50° C.–80° C. Preferably, the drying gas is directed to the microelectronic devices at a temperature that effectively vaporizes the process liquid more quickly than at room temperature.

Preferably, drying gas is supplied to the gas distribution devices 22, 24, and 26 by the gas supply inlet 110, which preferably includes the valve 112 for controlling the flow of gas. As mentioned above, each of the gas distribution devices 22, 24, and 26 may have a separate drying gas supply or they may be commonly supplied by using any known or developed gas handling techniques or devices.

Figure 7:
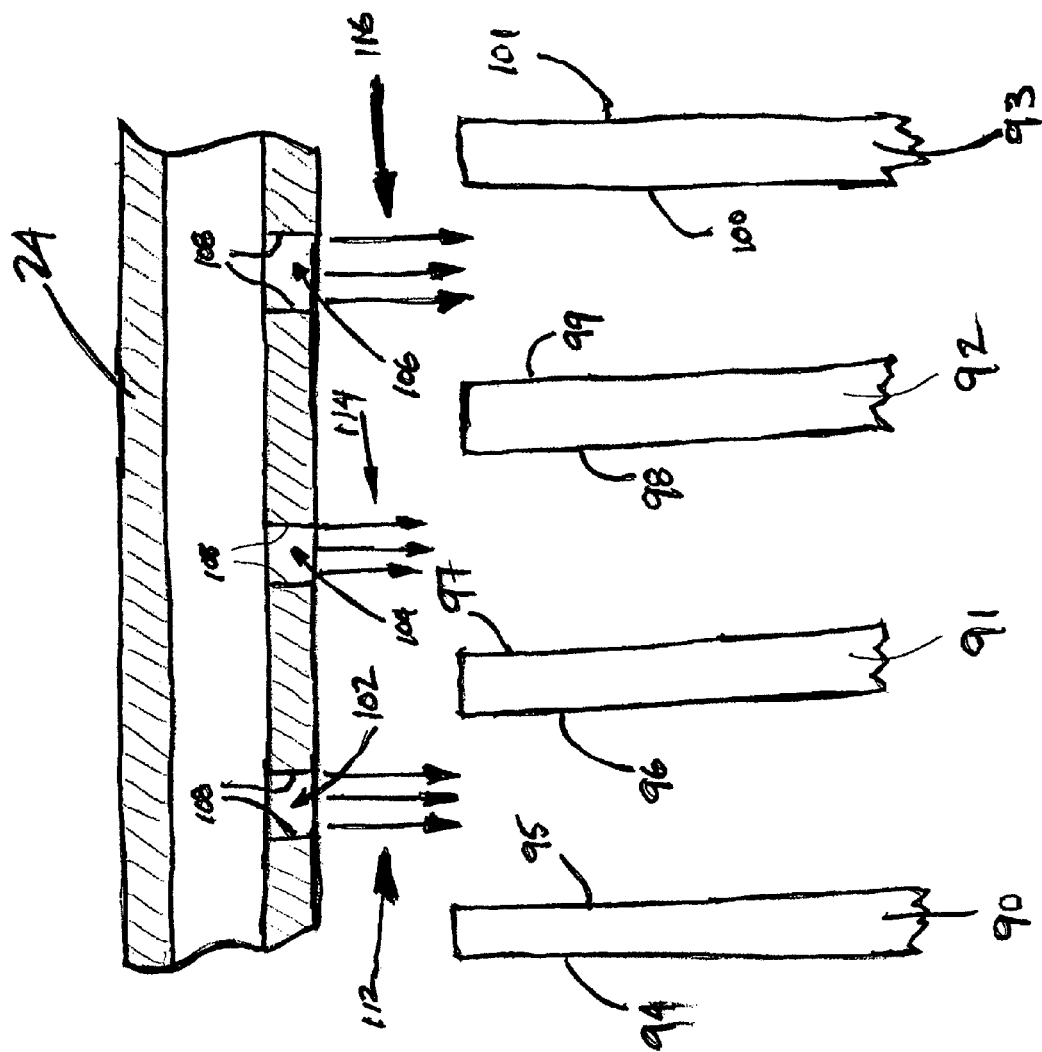
FIG. 7 is a partial cross-sectional side view of a gas distribution device of the present invention positioned above a plurality of microelectronic devices and showing in particular plural gas distribution orifices.

In FIG. 7, the gas distribution device 24 is shown in partial cross-section positioned above microelectronic devices 90, 91, 92, and 93. The microelectronic device 90 includes first and second major surfaces 94 and 95. Microelectronic device 91 includes first and second major surfaces 96 and 97. Microelectronic device 92 includes first and second major surfaces 98 and 99. And, microelectronic device 93 includes first and second major surfaces 100 and 101.

The gas distribution device 24 preferably includes circularly shaped (see FIG. 7) orifices 102, 104, and 106 for supplying gas columns 112, 114, and 116. As such, the gas columns may form a gas curtain in accordance with the present invention such as the gas curtain 78. Preferably, the orifices 102, 104, and 106 comprise directional side walls 108 that are substantially non-diverging or non-converging for shaping columnar gas streams as illustrated. As such, the orifices 102, 104, and 106 can each direct a columnar shaped stream of drying gas (as part of the gas curtain 78) with respect to the major surfaces of the microelectronic device being processed. As described above, the individual columnar streams of gas from the orifices 102, 104, and 106 collectively form the gas curtain. It is contemplated that such gas streams could be diverging or otherwise, but it is preferable that the gas streams are substantially directional, as described below, at least in a direction toward the microelectronic devices.

Preferably, the gas distribution device 24 is designed such that one or more gas columns such as the gas columns 112, 114, and 116 can be directed between pairs of microelectronic devices. Such is preferably provided for each microelectronic device supported within the vessel 12. In other words, a single gas column may be directed between each pair of microelectronic devices or plural gas columns may be directed between any such pair of microelectronic devices. As shown, gas column 112 is directed between microelectronic devices 90 and 91, gas column 114 is directed between microelectronic devices 91 and 92, and gas column 116 is directed between microelectronic devices 92 and 93. Although any gas column may be directed at a microelectronic device (not between), it is preferred that at least one gas column is directed between pairs of microelectronic devices. As such, a significant amount of substantially unobstructed gas flow over the surfaces of the microelectronic devices can be provided. Such substantially unobstructed gas flow over the microelectronic device surface results in improved microelectronic device drying characteristics with less microelectronic device contamination. It is noted that any number of gas distribution devices may be used for any number of microelectronic devices such as the gas distribution devices 22, 24, and 26 described above.

The gas distribution devices 22, 24, and 26 preferably produce gas flow at a predetermined velocity to cover a desired number of microelectronic devices. Each gas distribution device may produce gas flow of, for example, nitrogen gas at any flow rate to generate any amount of drying gas flow within the vessel; however, for 300 mm wafers, it is preferred for each gas distribution device 22, 24 and 26 to deliver between 100 slm and 300 slm, and more preferably about 200 slm. It is noted that the gas distributions devices 22 and 26 are preferably similar to the gas distribution device 24 described above but may alternatively be designed to provide any desired flow characteristics, which flow characteristic may be different from gas distribution device 24. Further, any number of gas distribution devices may be used in accordance with the present invention, each of which may have different flow characteristics.

Preferably, the gas distribution devices 22, 24, and 26 are operatively attached to the lid 18 so that each of the gas distribution devices 22, 24, and 26 extends longitudinally in a direction generally perpendicular to a surface of a microelectronic device of the set of microelectronic devices 14. That is, preferably, the gas distribution devices 22, 24, and 26 extend in a direction parallel to a central axis of an arranged set of microelectronic devices 14 at predetermined spacing. Such an arrangement of the gas distribution devices 22, 24, and 26 can provide a uniform gas flow regime with respect to the set of microelectronic devices 14 within the immersion vessel 12 as is described below. It is contemplated however, that the gas distribution devices 22, 24, and 26 may be angularly oriented with respect to the surface of a microelectronic device of the arranged set of microelectronic devices 14, other than perpendicularly, to achieve any desired gas flow requirements or uniformity depending on the application.

The gas distribution devices 22, 24, and 26 are preferably positioned to be above and spaced apart from the set of microelectronic devices 14 as shown in FIGS. 1 and 2. Also, the illustrative gas distribution devices 22, 24, and 26 are preferably equally spaced apart from each other, which spacing may be varied depending on the application. Spacing between devices 22, 24 and 26 and between orifices 88 thereof is dependent, in part, on the size of the microelectronic devices processed, as well as on the pitch or spacing between them as such pitch is commonly set as a standard for particular sized devices or wafers as they are to be supported for processing and transport. Like gas flow rates, spacings and sizes can be adjusted accordingly for improved effectiveness with different type and sizes of devices. Microelectronic devices 14 are typically supported, as described above, by support structure within the vessel 12, by a movable cassette, or other transport structure or the like. Moreover, such structure usually defines the spacing and arrangement of the microelectronic devices as they will be processed. In accordance with the present invention, it is desirable that the microelectronic devices 14 be supported within the vessel 12 according to a predetermined arrangement so that the gas distribution device(s) 22, 24 and 26 utilized provide at least one orifice 88 between each pair of microelectronic devices 14. The microelectronic devices 14 need not be regularly spaced or aligned at a common central axis (in the case of circular wafers), but typically they would be. In the gas of using linear extending gas distribution devices, such as 22, 24 and 26, it is preferable that the microelectronic devices 14 at least be arranged generally linearly with general evenness of spacing between any pair of microelectronic devices 14 for better controlled gas flow between them.

The gas distribution devices 22, 24, and 26 may also be mounted to the lid so as to be equally spaced away from the lid 18 as illustrated. As such, the gas distribution devices 22, 24, and 26 can be removed with the lid 18 so that the cassette 16 with the set of microelectronic devices 14 may easily be moved into and out of the immersion vessel 12. Alternatively, the gas distribution devices 22, 24, and 26 may be spaced at differing distances from the set of microelectronic devices 14 or from each other depending on the application. The spacing of the gas distribution devices 22, 24, and 26 from the set of microelectronic devices 14 and from each other may be varied depending on the particular application. Factors considered in positioning the gas distribution devices 22, 24, and 26 may include the microelectronic device size, processing fluid type, drying gas type, and desired flow characteristic.

In one illustrative embodiment shown in FIG. 4, the gas distribution devices 22, 24, and 26 may be designed and provided to direct the gas curtains 76, 78, and 80 respectively in an initial direction generally perpendicular to the bottom wall 32 of the immersion vessel 12 and parallel to the end walls 30. In other words, each of the gas curtains 76, 78, and 80 are directed substantially perpendicularly to a reference plane that passes through a central axis of the regularly arranged microelectronic devices 14. In such an arrangement, it has been discovered that as the gas flow increases, the outer gas curtains 76 and 80 may be drawn closer to the center gas curtain 78 by the flow of the gas curtain 78 as is illustrated in FIG. 4. Thus, for certain applications, such as a process having high gas flow and large microelectronic devices, the gas curtains 76 and 80 may be drawn toward the center gas curtain 78 away from the outside edges of the microelectronic devices thereby reducing gas flow at the outside edges of the microelectronic devices. Different gas flow rates from one gas distribution device to another can be utilized to facilitate such.

It has further been discovered that the position of the gas curtains 76 and 80 and the uniformity of the gas flow of the gas curtains 76, 78, and 80 together may be controllably adjusted. By directing the gas curtains 76 and 80 away from each other and toward the side walls 30, as illustrated in FIG. 5, gas flow over the microelectronic device surfaces can be controlled to provide a controlled gas flow and improved drying. That is, the gas curtains 76 and 80 are preferably directed at an angle away from the gas curtain 78, whereas the combination affect with the drawing tendency of the center gas curtain 78 is to controllably direct the drying gas flow. As illustrated in FIG. 5, it may be desirable to have curtains 76 and 80 directed more so to support contact points where liquid has a greater tendency to accumulate. It is noted that the positions of the gas distribution devices 22, 24, and 26, with respect to the set of microelectronic devices 14 and with respect to each other, as well as the angles of gas distribution devices 22 and 26 with respect to gas distribution device 24 may be empirically determined for a particular application. In other words, a trial and error process may be used to characterize a particular immersion vessel 12 for achieving optimized gas flow requirements for a particular microelectronic device size, for example. Note also that FIGS. 4 and 5 show certain desirable flow patterns through the devices and back within the immersion vessel, but that flow patterns back up the side walls and beyond are very dependent on design aspects of how the gas is exhausted and thus are not illustrated. Returning gas flow is also largely affected by spacing between the devices and side walls of the vessel, which spacing is preferably minimized to reduce process chemical usage. Other factors may also affect such flow patterns, in particular after gas flows initially past the devices. For example, with some devices, it may be desirable to open the quick dump valve or door which may further create back flow from ambient air.

As an example, when processing 300 mm microelectronic devices, three gas distribution devices may preferably be used, such as the gas distribution devices 22, 24, and 26 shown in FIG. 5. Preferably, the gas distribution devices 22 and 26 are spaced apart by about 76 mm from each other with the gas distribution device 24 approximately centered an equal distance between them. Also preferably, the set of microelectronic devices 14 is positioned such that, as seen in cross-section in FIG. 5, the center of microelectronic device 29 is positioned about 185 mm from the center of the gas distribution device 24. More preferably, the gas curtain 78 is directed towards the bottom plate 32 while the gas curtains 76 and 80 are directed at an angle of about 30° away from the gas curtain 76 and toward the side walls 30.

Referring again to FIGS. 1 and 2, a preferred process in accordance with the present invention may be performed as follows. A set of microelectronic devices is preferably loaded into the cassette 16 by any technique such as by hand or by a robot. The immersion vessel 12 is preferably filled with a rinsing liquid such as room temperature DI water by liquid inlet 52 and allowed to cascade such that an overflow sensor or the like signals a robot, for example, to place the cassette 16 into the immersion vessel 12 while the lid 18 is open. Alternatively, the cassette could be placed in the immersion vessel 12 before or any time while DI water enters the immersion vessel 12. Once the cassette 16 is positioned within the immersion vessel 12, the cascading DI water is preferably allowed to cascade for a predetermined amount of time, depending upon the specific application. After such time period, the liquid inlet 52 is closed and drain 58 is opened, which allows the DI water to drain from the immersion vessel 12 at a controlled predetermined rate. At the same time that the drain is opened, any or all of the nozzle 20 and/or gas distribution devices 22, 24, and 26 preferably introduce a cleaning enhancement substance and a carrier gas such as nitrogen and IPA to the immersion vessel 12 at a rate sufficient to replace the draining liquid. Once the DI water is drained to a predetermined level, below the microelectronic devices for example, the quick dump drain 62 may be opened to rapidly remove the remaining DI water. Once the DI water is substantially drained from the immersion vessel 12, drying gas, such as heated N2, is preferably delivered to the immersion vessel by the gas distribution devices 22, 24, and 26 with or without delivery of cleaning enhancement substance. After a predetermined drying time, the drying gas is turned off, the lid 18 may be opened, and the cassette 16 may be removed.

Numerous characteristics and advantages of the invention meant to be described by this document have been set forth in the foregoing description. It is to be understood, however, that while particular forms or embodiments of the invention have been illustrated, various modifications, including modifications to shape, and arrangement of parts, and the like, can be made without departing from the spirit and scope of the invention.

The invention claimed is:

1. A method for processing at least one microelectronic device comprising:

immersing at least a portion of at least one microelectronic device into a liquid bath provided within a vessel for performing a treatment on at least the immersed portion thereof;

separating the microelectronic device from the liquid bath by replacing said liquid with a gas environment adjacent to at least a surface portion of the microelectronic device; and delivering a cleaning enhancement substance during said replacing, said cleaning enhancement substance causing a concentration gradient of said cleaning enhancement substance in liquid at an interface between the surface of the microelectronic device and the liquid bath to enhance fluid flow from the microelectronic device surface, wherein the delivery of the cleaning enhancement substance is varied from a first stage to a second stage during said replacing step by changing a flow rate of delivery of cleaning enhancement substance from a first predetermined flow rate during the first stage to a second predetermined flow rate during the second stage.

2. The method of claim 1, wherein delivery of cleaning enhancement substance is further varied to at least a third stage by changing a flow rate of delivery of cleaning enhancement substance from the second flow rate to a third flow rate.

3. The method of claim 1, wherein the cleaning enhancement substance is delivered into the vessel at a substantially even concentration of between 0.5 percent and 3.6 percent within a carrier gas.

4. The method of claim 1, wherein at least one flow rate is varied by increasing the flow rate.

5. The method of claim 3, wherein the cleaning enhancement substance comprises IPA and the carrier gas comprises nitrogen.

6. The method of claim 4, wherein the separation is performed by lowering the liquid level within the vessel.

7. The method of claim 6, wherein the liquid level is lowered below the at least one microelectronic device and the delivery of cleaning enhancement substance is continued while the liquid level is lowered further.

8. The method of claim 7, wherein a quick dump of remaining liquid is conducted at a point after the liquid level is lowered below the at least one microelectronic device while the cleaning enhancement substance is delivered.

9. The method of claim 8, further comprising a step of drying the at least one microelectronic device by supplying at least one gas stream directed within the vessel to dry a surface of the at least one microelectronic device, and wherein delivery of cleaning enhancement substance is continued for at least an initial portion of the drying step.

* * * * *